US008724325B2

(12) United States Patent
Schnetker et al.

(10) Patent No.: US 8,724,325 B2
(45) Date of Patent: May 13, 2014

(54) SOLID STATE SWITCH ARRANGEMENT

(75) Inventors: Ted R. Schnetker, Rockford, IL (US); Steven J. Sytsma, Waukegan, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 190 days.

(21) Appl. No.: 12/468,110

(22) Filed: May 19, 2009

(65) Prior Publication Data

US 2010/0296254 A1    Nov. 25, 2010

(51) Int. Cl.
*H05K 7/20* (2006.01)
(52) U.S. Cl.
USPC ............ 361/709; 361/704; 361/707; 361/775
(58) Field of Classification Search
USPC .......................................... 361/775; 363/141
See application file for complete search history.

(56) References Cited

U.S. PATENT DOCUMENTS

| | | | |
|---|---|---|---|
| 3,435,891 A * | 4/1969 | Parrish .......................... 165/121 |
| 3,728,585 A * | 4/1973 | Olashaw ...................... 361/677 |
| 4,458,305 A * | 7/1984 | Buckle et al. ................. 363/141 |
| 4,670,817 A * | 6/1987 | Whitehead et al. ........... 361/708 |
| 4,739,448 A * | 4/1988 | Rowe et al. ................... 361/719 |
| 4,748,495 A | 5/1988 | Kucharek |
| 5,053,920 A * | 10/1991 | Staffiere et al. ............... 361/694 |
| 5,275,887 A * | 1/1994 | Johnson et al. ............... 428/422 |
| 5,940,263 A * | 8/1999 | Jakoubovitch ................ 361/328 |
| 6,036,508 A | 3/2000 | Anderson et al. |
| 6,084,764 A | 7/2000 | Anderson |
| 6,166,903 A | 12/2000 | Ranchy |
| 6,215,681 B1 * | 4/2001 | Schuurman et al. .......... 363/141 |
| 6,278,199 B1 * | 8/2001 | Grant et al. ................... 307/10.1 |
| 6,319,757 B1 | 11/2001 | Parsons |
| 6,470,224 B1 | 10/2002 | Drake et al. |
| 6,618,275 B2 | 9/2003 | Suzuki et al. |
| 6,678,182 B2 | 1/2004 | Joseph et al. |
| 6,727,436 B2 * | 4/2004 | Barnes et al. ................. 174/255 |
| 6,822,850 B2 | 11/2004 | Pfeifer et al. |
| 6,856,045 B1 | 2/2005 | Beneditz et al. |
| 6,885,553 B2 | 4/2005 | Pfeifer et al. |
| 7,391,622 B2 | 6/2008 | Marshall et al. |
| 7,916,480 B2 | 3/2011 | Woody et al. |
| 2002/0149021 A1 | 10/2002 | Casady |
| 2004/0007772 A1 | 1/2004 | Arai et al. |
| 2005/0098876 A1 | 5/2005 | Hirao et al. |
| 2005/0248023 A1 | 11/2005 | Maier |
| 2006/0087349 A1 * | 4/2006 | Bird et al. ..................... 327/112 |

FOREIGN PATENT DOCUMENTS

| | | |
|---|---|---|
| EP | 1596434 | 11/2005 |
| JP | 2004140068 | 5/2004 |
| JP | 2006066582 | 3/2006 |
| JP | 2006134990 | 5/2006 |
| WO | 99/19906 | 4/1999 |
| WO | 2007/132683 | 11/2007 |

OTHER PUBLICATIONS

European Search Report dated Mar. 3, 2011.

* cited by examiner

*Primary Examiner* — Gregory Thompson
(74) *Attorney, Agent, or Firm* — Carlson, Gaskey & Olds, P.C.

(57) ABSTRACT

An example solid state switching arrangement includes at least one bus bar configured to carry electrical current and at least one switch that is silicon carbide based. The switch is secured relative to the bus bar and the bus bar is configured to communicate thermal energy away from the switch. An example method of arranging a switch includes mounting a silicon carbide based switch relative to a bus bar and communication thermal energy away from the silicon carbide based switch using the bus bar.

23 Claims, 3 Drawing Sheets

SOLID STATE SWITCH ARRANGEMENT

BACKGROUND

This application relates generally to switches, and more particularly, to a mounting arrangement of solid state switches.

Switches perform switching functions within many types of units, such as power conversion units, motor control units, power switching units, and power distribution units, etc. The units often include solid state switches instead of mechanical based switches to avoid complications associated with moving components of the mechanical based switches. Switches, especially the solid state switches, generate thermal energy during operation. Interconnects are often incorporated into the unit to move thermal energy away from the switches. Undesirable results associated with incorporating the interconnects include added weight, increased packaging requirements, increased inductance, increased capacitance, increased assembly costs, and possible mechanical or electrical interconnect failures. The interconnects also resist movement of thermal energy. These results are especially undesirable in aerospace or space applications where the unit's excessive size and weight can impact performance of an airframe or spaceframe incorporating the unit.

In the prior art, silicon solid state switches and germanium solid state switches are sometimes used instead of mechanical switches. These types of solid state switches are unable to operate at very high temperatures. Accordingly, units that include these solid state switches also include substantially cooling structures. These types of solid states switches are also bulky, which is especially disadvantageous in applications where excessive size and weight can impact performance, such as aerospace or space applications.

SUMMARY

An example solid state switching arrangement includes at least one bus bar configured to carry electrical current and at least one switch that is silicon carbide based. The switch is secured relative to the bus bar and the bus bar is configured to communicate thermal energy away from the switch.

An example solid state switching arrangement includes at least one solid state switch, a first bus bar configured to carry electrical current, and a second bus bar configured to carry electrical current. The first bus bar is electrically isolated from the second bus bar. The at least one solid state switch includes a first switch portion directly mounted to the first bus bar and a second switch portion directly mounted to the second bus bar.

An example method of arranging a switch includes mounting a silicon carbide based switch relative to a bus bar and communicating thermal energy away from the silicon carbide based switch using the bus bar.

These and other features of the example disclosure can be best understood from the following specification and drawings, the following of which is a brief description.

DETAILED DESCRIPTION

Figure 1:
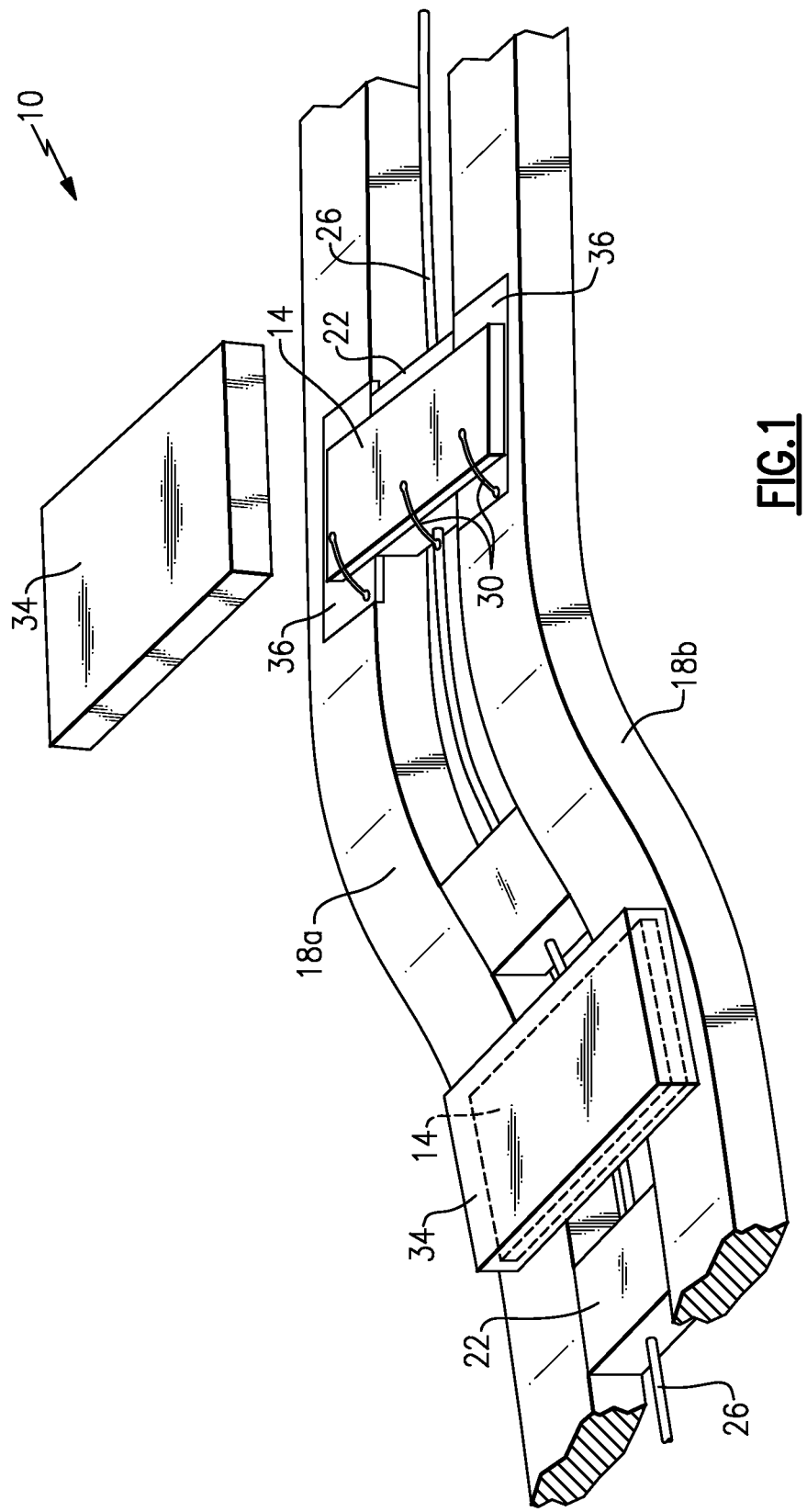
FIG. 1 shows a partial view of an example mounting arrangement of solid state switches.

FIG. 1 shows an example mounting arrangement 10 including a multiple of switches 14 each having a portion mounted to a first bus bar 18a and a portion mounted to a second bus bar 18b. An insulating material 22 is positioned between the first bus bar 18a and the second bus bar 18b. The insulating material 22 electrically isolates the first bus bar 18a from the second bus bar 18b. Examples of the insulating material 22 include solids, liquids, gasses, or a vacuum.

In this example, control wires 26 facilitate electrical communication throughout the mounting arrangement 10. For example, a plurality of bond wires 30 facilitate electrical and thermal communication between the switches 14, the first bus bar 18a, the second bus bar 18b, and the control wires 26. The example insulating material 22 is a solid material that holds control wires 26 away from the first bus bar 18a and the second bus bar 18b so that communications are routed through the bond wires 30.

A cover 34 houses each of the switches 14. The cover 34 is a dam and fill type cover that encapsulates the switches 14, for example. In other examples, the cover 34 is a dispensed liquid cover, vapor deposition cover. These types of the cover 34 encapsulate the switches 14 and are typically used when the switches 14 are bare die switches. In some examples, a single one of the cover 34 protects more than one of the switches 14. Other protective arrangements are also possible.

The switches 14, in this example, have a portion mounted directly to the first bus bar 18a and another portion mounted directly to the second bus bar 18b. Example techniques for directly mounting the switches 14 include metallurgically bonding or soldering the switches 14 to the bus bars 18a and 18b. Other examples include using a resin, epoxy, or mechanical attachment feature, such as a screw, to secure the switches 14 to the bus bars 18a and 18b. Wire bonding, ribbon bonding, lead frame bonding, via-in-silicon, beam bonding, and other methods could also be used to secure the switches 14 to the bus bars 18a and 18b, for example.

In one example, the bus bars 18a and 18b include an interposer layer 36. The switches 14 are mounted directly to at least a portion of the interposer layer 36 that is incorporated into the bus bars 18a and 18b. The interposer layer 36 is configured to communicate thermal energy between the switches 14 and the bus bars 18a and 18b. The switches 14 are mounted to a printed wiring board in another example.

Figure 2:
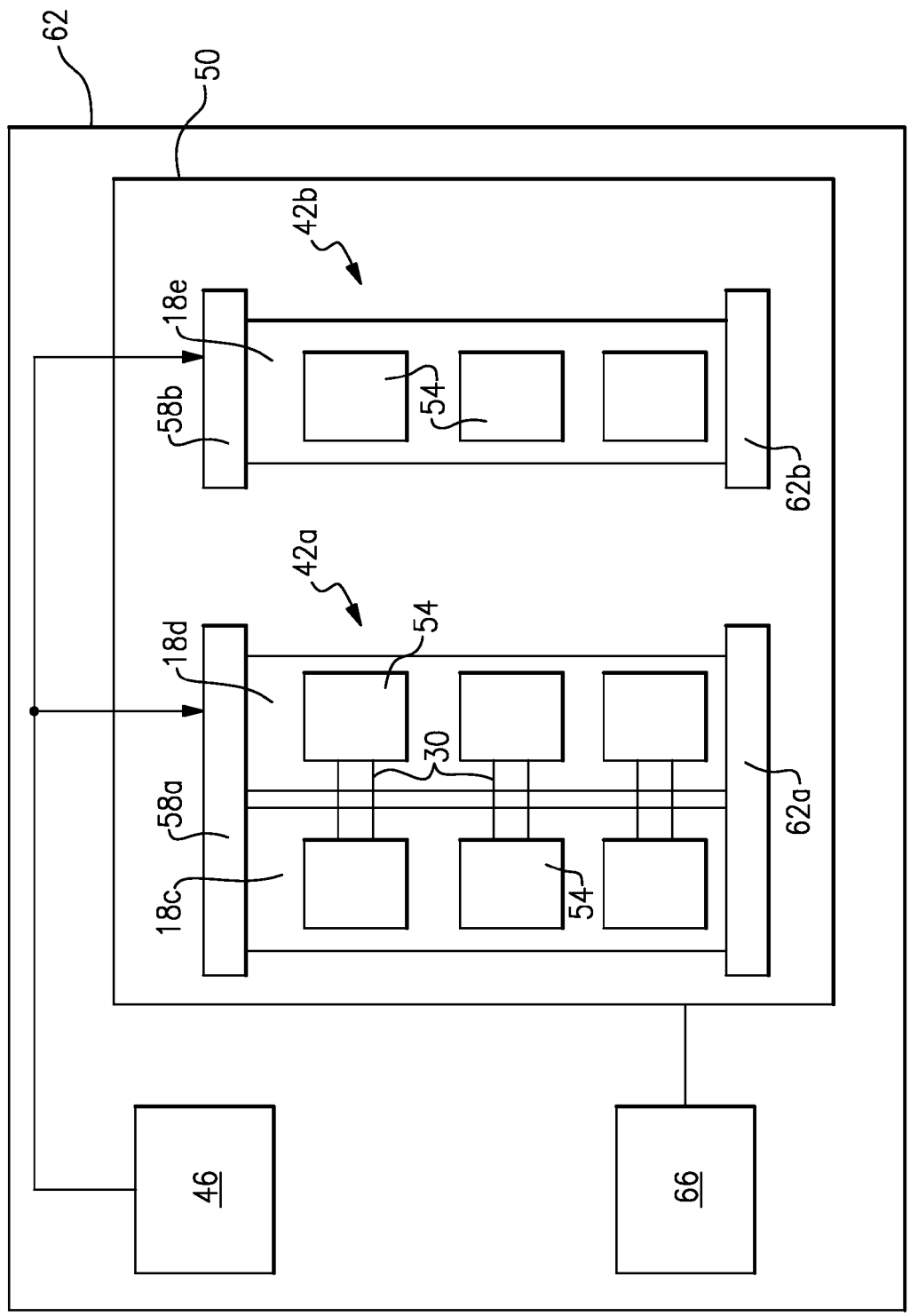
FIG. 2 schematically shows other example mounting arrangements of solid state switches.

Referring to FIG. 2 with continuing reference to FIG. 1, other mounting arrangements 42a and 42b each include a one or more switches 54. A power supply 46 supplies power to the mounting arrangements 42a and 42b, which form a portion of a motor control unit 50, for example.

The solid state switches 54 are silicon carbide based. In this example, the switches 54 are each mounted directly to one of the bus bars 18c, 18d, or 18e, which are each configured to carry electrical current within the motor control unit 50 between a first powered device 58a or 58b to a corresponding second powered device 62a or 62b.

Bond wires 30 electrically connect the switches 54 on the bus bar 18c to the switches 54 on the bus bar 18d. The mounting arrangement 42a includes the bus bar 18c and the bus bar 18d. The mounting arrangement 42b includes the bus bar 18e.

Mounting the switches 54 directly to the bus bars 18c, 18d, and 18e enables current moving through the bus bars 18c, 18d, and 18e to power the switches 54. Mounting the switches 54 directly to the bus bars 18c, 18d, and 18e also enables thermal energy to move from the switches 54 to the bus bars 18c, 18d, and 18e. The thermal energy can then more effectively radiate to the surrounding environment. The example motor control unit 50 is used within an aircraft 62 for various functions, such as monitoring temperatures and vibrations of an aircraft engine 66.

Figure 3:
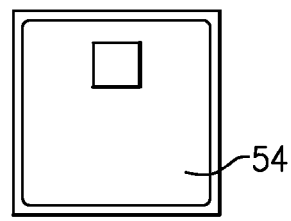
FIG. 3 shows a top view of an example switch from one of the FIG. 2 mounting arrangements.
Figure 4:
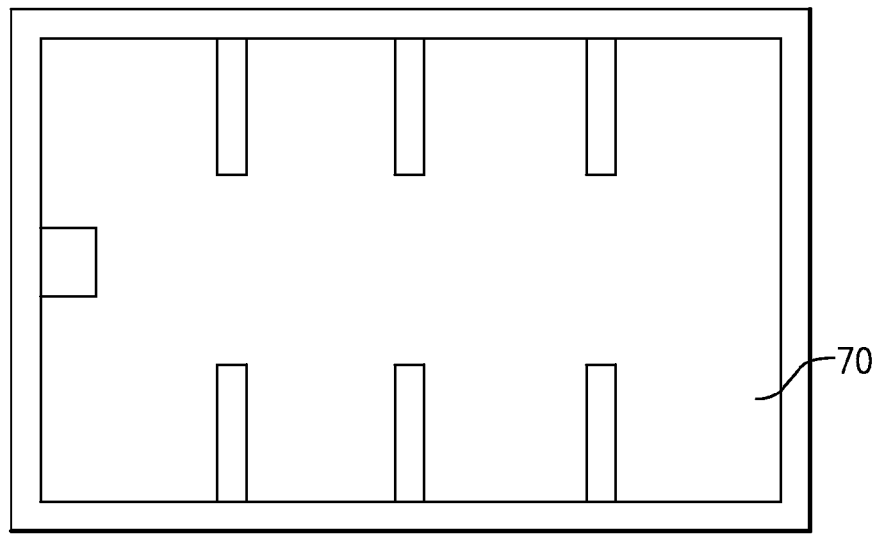
FIG. 4 shows a top view of a prior art switch.

FIGS. 3 and 4 show one of the switches 54 and a prior art switch 70. The switches 54 are silicon carbide switches, whereas the prior art switch 70 is a silicon switch. In this example, the switches 54 are each about 10 mm$^2$ and can operate at temperatures of up to 225° C. and voltages of up to 900 V. By contrast, the prior art switch 70 is about 70 mm$^2$ and can operate at temperatures of up to 150° C. and voltages of up to 600 V. As can be appreciated, the switches 54 are operable at much higher temperatures than the prior art switch 70.

Figure 5:
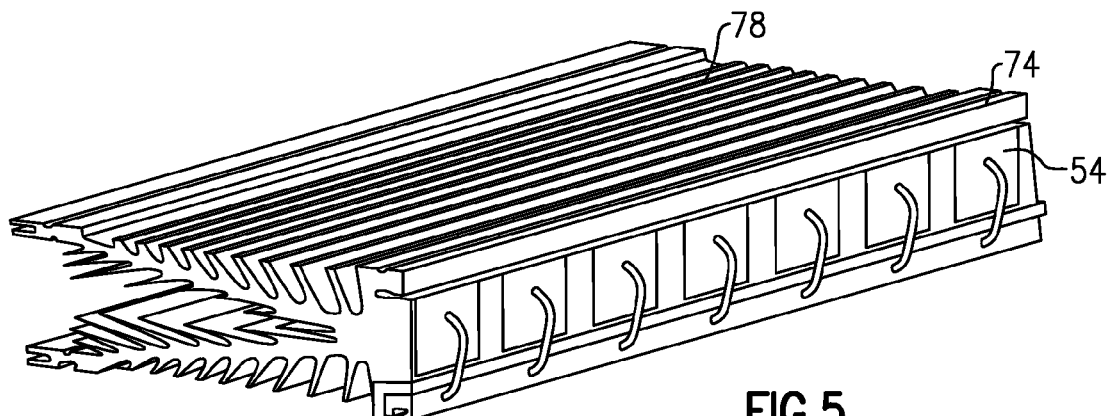
FIG. 5 shows yet another example mounting arrangement of solid state switches.

Referring to FIG. 5, in this example, the switches 54 are mounted directly to a bus bar 74 having a plurality of fins 78. The switches 54 generate thermal energy during operation, which moves from the switches 54 to the bus bar 74. The fins 78 facilitate moving thermal energy away from the bus bar 74 by increasing the surface area of the bus bar 74.

Features of the disclosed embodiments include mounting a silicon carbide based switch directly to a bus bar and using a silicon carbide based switch to perform electrical power switching functions. Another feature includes directly mounting a single switch to more than one bus bar to facilitate removing thermal energy from the switch.

Although a preferred embodiment has been disclosed, a worker of ordinary skill in this art would recognize that certain modifications would come within the scope of this invention. For that reason, the following claims should be studied to determine the true scope and content of this invention.

We claim:

1. A solid state switching arrangement comprising:
   a solid state switch;
   a first bus bar configured to carry electrical current; and
   a second bus bar configured to carry electrical current, the first bus bar electrically isolated from the second bus bar, wherein the solid state switch includes a first portion of a planar continuous surface directly mounted and bonded to the first bus bar and a second portion of the planar continuous surface directly mounted and bonded to the second bus bar.

2. The arrangement of claim 1 including a cover configured to house the solid state switch, the solid state switch being the exclusive solid state switch housed by the cover.

3. The arrangement of claim 2 wherein the cover comprises at least one of a dam and fill coating material, a coating material dispensed as a liquid, a protective cap, or a vapor deposited material.

4. The arrangement of claim 1 wherein at least one of the first bus bar or the second bus bar comprises a plurality of fins that facilitate movement of thermal energy.

5. The arrangement of claim 1 wherein the first bus bar and the second bus bar are metallic.

6. The arrangement of claim 1, wherein the first bus bar and the second bus bar carry electrical current from a first powered device to a second powered device.

7. The arrangement of claim 6, wherein the first powered device and the second powered device are different than the solid state switch.

8. The arrangement of claim 1, wherein the solid state switch is a silicon carbide based switch.

9. A solid state switching arrangement comprising:
   a first bus bar that carries electrical current from a first electrically powered device to a second electrically power device;
   a second bus bar that carries electrical current from the first electrically powered device to the second electrically powered device;
   a first solid state switch mounted directly to the first bus bar and powered by the first bus bar; and
   a second solid state switch mounted directly to the second bus bar and powered by the second bus bar, wherein bond wires directly electrically couple the first and second solid state switches.

10. The solid state switching arrangement of claim 9, wherein the first and second electrically powered devices are different than the first and second solid state switches.

11. The solid state switching arrangement of claim 9, wherein the first solid state switch is mounted directly to the first bus bar through a continuous planar surface that is also bonded to the second bus bar, wherein the second solid state switch is mounted directly to the second bus bar through another continuous planar surface that is also bonded to the first bus bar.

12. The arrangement of claim 9 wherein the first bus bar is electrically isolated from the second bus bar.

13. The arrangement of claim 9 including an insulating material that electrically isolates the bus bar from the second bus bar.

14. The arrangement of claim 9 wherein the first solid state switch is secured to an interposer layer that is secured to the first bus bar.

15. The arrangement of claim 9 wherein the first bus bar is metallurgically bonded to the first solid state switch.

16. The arrangement of claim 9 wherein the first bus bar is metallic.

17. The arrangement of claim 9 wherein the first bus bar powers the first solid state switch.

18. A method of arranging a switch comprising:
   mounting a silicon carbide based switch to a first bus bar and a second bus bar; and
   communicating thermal energy away from the silicon carbide based switch using the first bus bar and the second bus bar, the mounting comprises securing a continuous surface of the silicon carbide based switch to the first bus bar and the second bus bar.

19. The method of claim 18 including wire bonding the silicon carbide based switch to the first bus bar and the second bus bar.

20. The method of claim 18 including electrically connecting the silicon carbide based switch to a second silicon carbide based switch that is mounted to a second bus bar.

21. The method of claim 19 wherein said mounting comprises at least one of metallurgically mounting, adhesively mounting, or mechanically mounting.

22. The method of claim 18 wherein said mounting comprises securing the silicon carbide based switch to an interposer layer that is secured to the first bus bar and the second bus bar.

23. The method of claim 18 wherein the mounting comprises metallically bonding the silicon carbide based switch to the first bus bar and the second bus bar.

* * * * *